United States Patent [19]
Hay

[11] Patent Number: 5,902,144
[45] Date of Patent: May 11, 1999

[54] INTEGRATED CIRCUIT PACKAGE BURN-IN SOCKET LINKAGE SYSTEM

[75] Inventor: Doug Hay, Chandler, Ariz.

[73] Assignee: Intel Corporation, Santa Clara, Calif.

[21] Appl. No.: 08/912,094

[22] Filed: Aug. 15, 1997

[51] Int. Cl.[6] ................................................ H01R 4/50
[52] U.S. Cl. ................................ 439/342; 439/331
[58] Field of Search .................................. 439/259, 260, 439/342, 330, 331

[56] References Cited

U.S. PATENT DOCUMENTS

| | | | |
|---|---|---|---|
| 5,493,237 | 2/1996 | Volz et al. | 439/330 X |
| 5,629,836 | 5/1997 | Wright | 439/157 X |

Primary Examiner—Khiem Nguyen
Attorney, Agent, or Firm—Blakely, Sokoloff, Taylor & Zafman LLP

[57] ABSTRACT

A test socket for an integrated circuit package. The test socket includes a latch arm that is pivotally connected to a socket base so that the arm can move between an open position and closed position. The socket also has a spring that is attached to the base and a cover. The latch arm is pivotally connected to the cover by a linkage arm. An actuator pushes down on the cover and rotates the latch arm to an open position so that an integrated circuit package can be inserted into the socket. Movement of the cover also pushes the spring into a deflected position. When the cover is released, the potential energy of the deflected spring is transferred through the link and rotates the latch arm back to the closed position. The force of the spring is transferred to the latch arm to push the integrated circuit package into a plurality of electrical contacts of the socket.

8 Claims, 2 Drawing Sheets

INTEGRATED CIRCUIT PACKAGE BURN-IN SOCKET LINKAGE SYSTEM

BACKGROUND OF THE INVENTION

1. Field of the Invention

The present invention relates to a test socket for an integrated circuit package.

2. Description of Related Art

Integrated circuits are assembled into packages which have a plurality of external contacts that are coupled to a printed circuit board. The assembled integrated circuit packages are tested within a test socket before being assembled to the circuit board.

FIG. 1 shows a test socket of the prior art. The test socket includes an adaptor 1 that is bolted to a base 2 of the socket. The adaptor 1 contains a plurality of electrical contacts 3 that are connected to the external contacts of an integrated circuit package 4.

The socket has a spring loaded latch assembly 5 which presses the integrated circuit package 4 into the electrical contacts 3 of the adaptor 1. There are typically four latch assemblies located along each side of the socket. Each latch assembly 5 includes a latch arm 6 that is pivotally connected to the socket base 2. The socket base 2 also supports a spring 7 that is connected to a cover 8. Each latch 5 also contains a linkage arm 9 that is pivotally connected to both the cover 8 and the latch arm 6.

The socket has an actuator 10 which pushes the cover 8 toward the base 2 and rotates the latch arm(s) 6 to an open position. The integrated circuit package 4 is then inserted into the socket. The movement of the cover 8 also pushes the spring(s) 7 into a deflected position. When the cover 8 is released, the stored energy of the deflected spring(s) 7 moves the latch arm(s) 6 back to the closed position. The force of the spring(s) 7 is transferred through the link (9) connection to the latch arm(s) 6 to push the integrated circuit package 4 into the electrical contacts 3.

Some packages utilize flat solder pads instead of pins for the external contacts. These types of integrated circuit packages are sometimes referred to as land grid array (LGA) packages. The test socket shown in FIG. 1 was designed to test an integrated circuit which has a 540 LGA package. Integrated circuits have been developed with more than 540 external land contacts.

Test sockets designed for LGA packages require a significantly larger latch force than test sockets designed for pin grid array packages. It has been found that test sockets of the prior art will not adequately couple the electrical contacts to all of the external solder pads of an LGA package. Inadequate coupling between the electrical contacts and the solder pads creates invalid failures during a test routine of the package. This results in the properly functioning integrated circuit package to be discarded.

It would be desirable to provide a test socket that effectively tests LGA packages without significantly changing the test socket of the prior art. Significant changes would require additional tooling that increases the cost of the socket and, ultimately, the cost of producing the integrated circuit package.

SUMMARY OF THE INVENTION

A socket for testing an integrated circuit package. The socket includes a latch arm that is pivotally connected to a base. The base supports a latch spring that is attached to a cover. The socket also includes a linkage arm that is pivotally connected to both the cover and the latch arm. The linkage arm is connected to the latch arm at a point distal from the pivotal connection of the latch arm and the base.

DETAILED DESCRIPTION OF THE INVENTION

In one embodiment the present invention increases the length of a linkage arm of a test socket to increase the latching force that presses an integrated circuit package into the socket. The test socket includes a latch arm that is pivotally connected to a socket base so that the arm can move between an open position and closed position. The socket also has a spring that is attached to the base and a cover. The latch arm is pivotally connected to the cover by a linkage arm. An actuator pushes the cover and rotates the latch arm to an open position so that an integrated circuit package can be inserted into the socket. Movement of the cover also pushes the spring into a deflected position. When the cover is released the potential energy of the deflected spring rotates the latch arm back to the closed position. The force of the spring is transferred through the link to the latch arm to push the integrated circuit package into a plurality of electrical contacts of the socket. By way of example, the length of the linkage arm is such that the latch arm will provide a sufficient force to adequately couple the electrical contacts to a land grid array (LGA) integrated circuit package.

Figure 1:
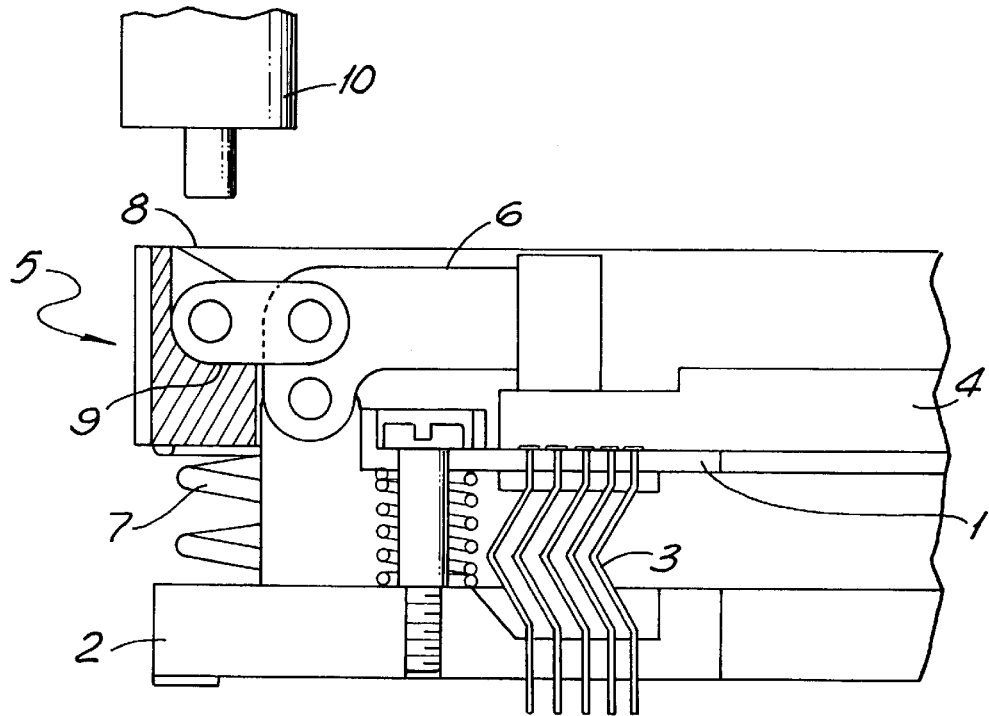
FIG. 1 is a side sectional view of a test socket of the prior art.
Figure 2:
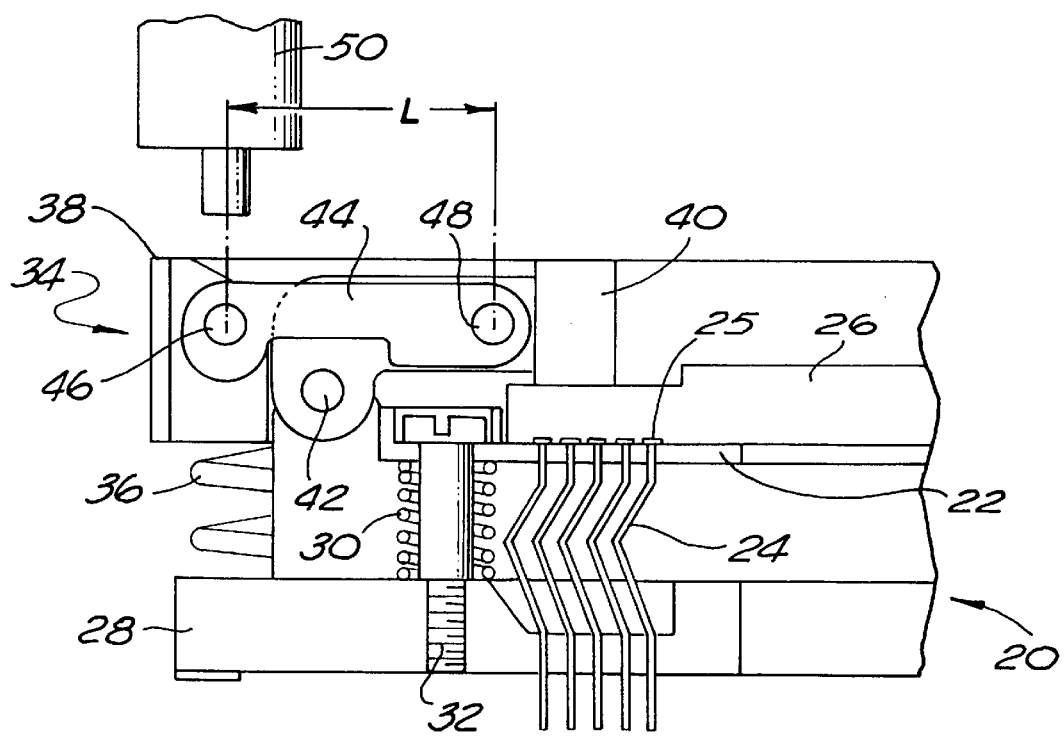
FIG. 2 is a side sectional view of a test socket of the present invention.

Referring to the drawings more particularly by reference numbers, FIG. 2 shows a test socket 20 of the present invention. The test socket 20 includes an adaptor 22 which contains a plurality of electrical contacts 24. The electrical contacts 24 are in contact with the external contacts 25 of an integrated circuit package 26. The integrated circuit package 26 contains an integrated circuit (not shown) that is electrically coupled to the external contacts of the package. The contacts 24 are also coupled to an electrical tester circuit(s) (not shown) which performs an electrical test(s) on the integrated circuit within the package 26.

In one embodiment, the socket has 540 electrical contacts 24 which can be coupled to a corresponding number of external contacts 25 of the integrated circuit package 26. The external contacts 25 of the integrated circuit package 26 may be flat solder pads as part of a package that is referred to as land grid array (LGA). Although an LGA package 26 is shown and described, it is to be understood that the test socket 20 of the present invention can be used to test other types of integrated circuit packages.

The adaptor 22 is mounted to a base 28 of the socket 20. The adaptor 22 is supported by an adaptor spring 30 and captured by a screw 32. There may be four adaptor springs 30 and four corresponding screws 32 for the socket 20. The electrical contacts 24 are typically bent so that the contacts 24 are deflected when the integrated circuit package 26 is loaded into the socket 20.

The socket 20 has a latch assembly 34 that presses the integrated circuit package 26 into the electrical contacts 24.

There are typically four latch assemblies for the socket 20, each latch assembly 34 being located along a side of the package 26. By way of example, the latch assemblies of the present invention provide a force sufficient to effectively couple an LGA package to the electrical contacts 24 of the socket 20.

Each latch assembly 34 includes a latch spring 36 that is mounted to the base 28. The springs 36 of each assembly 34 are attached to a cover 38 that extends circumferentially around the socket 20. Each latch assembly 34 also has a latch arm 40 that is pivotally connected to the base 28 by a pin 42. The latch arm 40 includes a distal end that is adjacent to the integrated circuit package 26 and a proximal end opposite from the distal end. The proximal end of the latch arm 40 is pivotally connected to the base 28.

A linkage arm 44 is pivotally connected to the cover 38 and the latch arm 40 by pins 46 and 48, respectively. The linkage arm 44 is connected to the latch arm 40 at a point that is distal to the pivotal connection of the arm 40 and the base 28. The linkage arm 44 typically has a length L that is longer than the distance separating pins 42 and 46.

Figure 3:
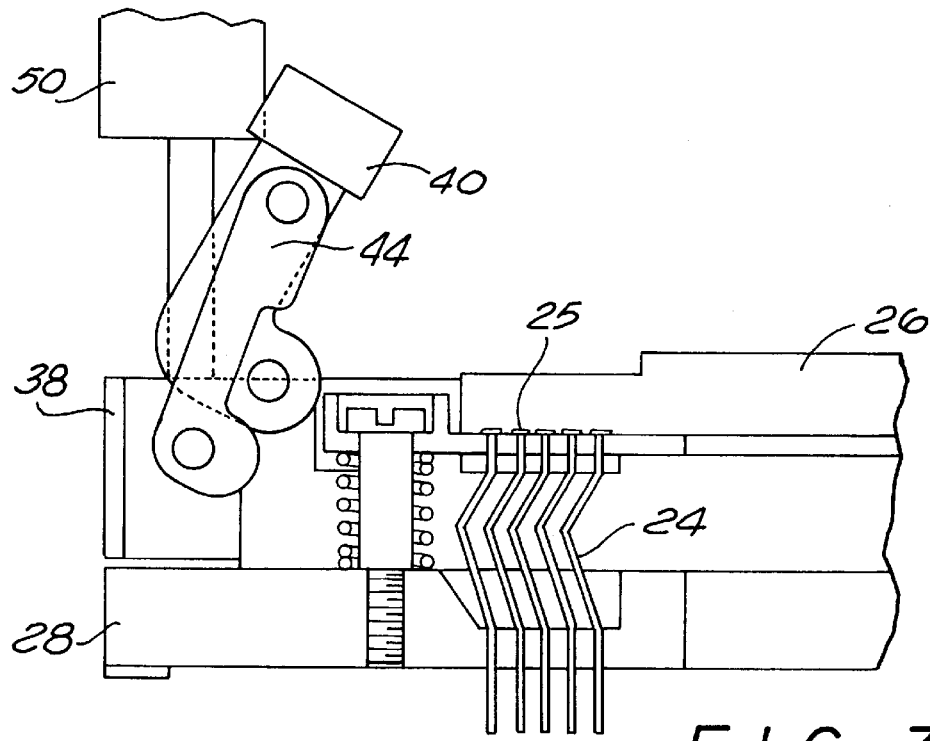
FIG. 3 is a side sectional view showing the test socket in an open position.

As shown in FIG. 3, the socket 20 has an actuator 50 which pushes the cover 38 toward the base 28 and rotates the latch arm 40 from a closed position to an open position. Movement of the arm 40 allows the integrated circuit package 26 to be replaced by another package 26.

Movement of the cover 38 also depresses the latch springs 36 to a deflected position. When the cover 38 is released, the potential energy stored in the deflected springs 36 pushes the cover 38 back to the original position shown in FIG. 2. Movement of the cover 38 is transmitted through the link 44 and rotates the latch arm 40 into the closed position. Rotation of the latch arm 40 pushes the integrated circuit package 26 into the electrical contacts 24 of the adaptor 22. Once loaded the integrated circuit package 26 can be tested through the contacts 24.

Figure 4:
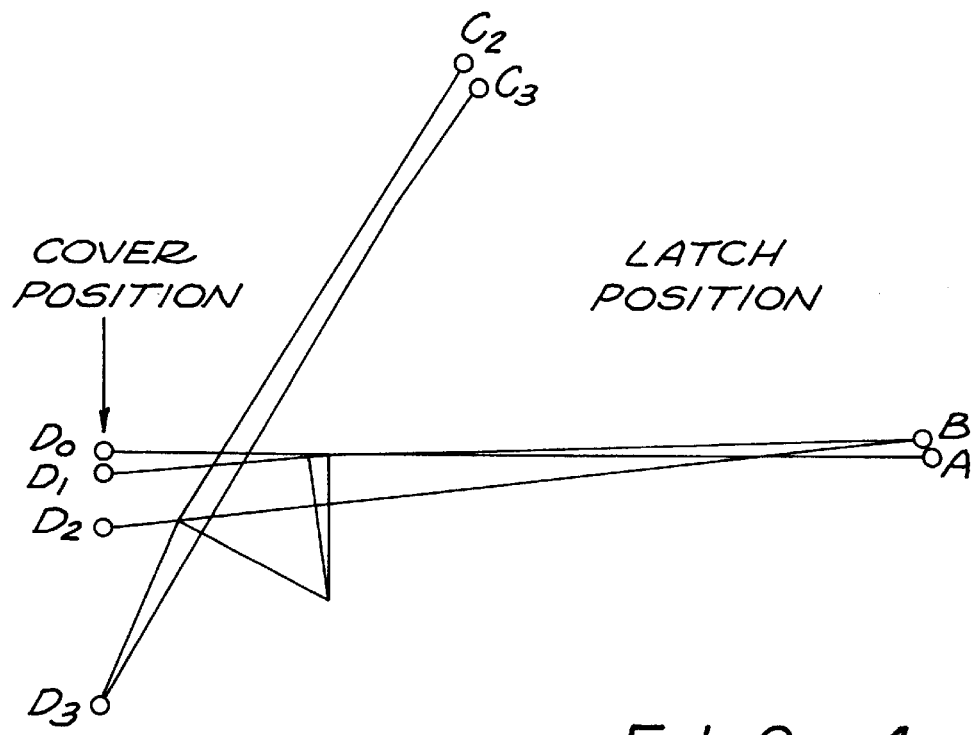
FIG. 4 is a graph showing a movement of a prior art test socket and the test socket of the present invention.

The longer linkage arm 44 of the present invention provides a greater latching force than test sockets of the prior art by utilizing the available spring force more efficiently. FIG. 4 is a graph that shows the relative position of the spring and latch arm during the actuation of the latch assembly 34. The top of the spring is located at $D_3$ when the latch arm is in the open position. $D_1$ shows the position of the spring when the cover is released and the latch arm first makes contact with package using a linkage arm of the prior art. $D_2$ shows the position of the spring for a linkage arm of the present invention when the latch arm first makes contact with the package. $D_0$ shows the position of the spring when the latch is in the fully closed position for test sockets of the prior art and the present invention.

As can be seen from FIG. 4 the longer linkage arm of the present invention provides an additional displacement of the spring ($D_2-D_1$) from the point where the latch first makes contact with the package to the final static position $D_0$. The additional displacement ($D_2-D_1$) multiplied by the spring rate of the springs provides a force that is additional to the force provided by sockets in the prior art. The additional latching force creates a greater deflection of the adaptor 22 and insures that the contacts are electrically coupled to the integrated circuit package 26.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A test socket for an integrated circuit package, comprising:

a base;

a latch arm that has a distal end, and a proximal end that is pivotally connected said base;

a latch spring that is attached to said base;

a cover that is attached to said latch spring; and, a linkage arm that is pivotally connected to said cover and said latch arm, said linkage arm having a length that is substantially greater than a distance which separates said pivotal connection of said latch arm and said base, and said pivotal connection of said cover and said linkage arm.

2. The test socket as recited in claim 1, further comprising an adaptor that is attached to said base and which has a plurality of electrical contacts.

3. The test socket as recited in claim 1, wherein said latch arm moves between an open position and a closed position.

4. The test socket as recited in claim 3, wherein said latch spring biases said latch arm into the closed position.

5. The test socket as recited in claim 4, further comprising an actuator that moves said latch arm to the open position.

6. A method for testing an integrated circuit package within a socket that has a latch arm pivotally connected to a base, a latch spring attached to the base, a cover attached to the latch spring, and a linkage arm that is pivotally connected to the cover, said linkage arm having a length that is substantially greater than a distance which separates said pivotal connection of said latch arm and said base, and said pivotal connection of said cover and said linkage arm, the socket further having an adaptor that is attached to the base and which contains a plurality of electrical contacts, comprising:

a) moving the latch arm to an open position;

b) inserting an integrated circuit package into the socket; and, c) moving the latch arm to the closed position so that the latch arm presses the integrated circuit package into the electrical contacts of the adaptor.

7. The method as recited in claim 6, wherein the latch arm is moved to the open position by pushing the cover and deflecting the latch spring.

8. The method as recited in claim 7, wherein the latch arm is moved to the closed position by releasing the cover.

* * * * *